(12) United States Patent
Whitman et al.

(10) Patent No.: US 6,195,259 B1
(45) Date of Patent: Feb. 27, 2001

(54) HOT PLUG CARTRIDGE ASSEMBLY

(75) Inventors: Brian T. Whitman, Seattle; Susan F. Smith; Mark W. Anderson, both of Olympia, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/358,373

(22) Filed: Jul. 21, 1999

(51) Int. Cl.[7] .................................................... H05K 7/16
(52) U.S. Cl. ......................... 361/725; 361/753; 361/801; 361/756
(58) Field of Search ..................................... 361/725, 726, 361/727, 685, 753, 754, 756, 759, 801

(56) References Cited

U.S. PATENT DOCUMENTS 5,995,364 * 11/1999 McAnally et al. ................... 361/685

* cited by examiner

*Primary Examiner*—Leo P. Picard
*Assistant Examiner*—Hung Van Duong

(74) *Attorney, Agent, or Firm*—Antonelli, Terry Stout & Kraus, LLP

(57) ABSTRACT

Disclosed are a hot plug method and a hot plug cartridge assembly for a card component (e.g., peripheral component interconnect compliant card). The cartridge assembly includes a carrier, a holder for the card component and a lever, the holder and lever being movably retained on the carrier. The lever has a camming surface, and the carrier has a protrusion following on the camming surface. Due to the configuration and positioning of the camming surface, lateral motion of the lever causes vertical movement of the lever and holder, to cause vertical movement of the card component. Lateral motion of the lever after introduction of the cartridge assembly into a system causes the card component to move vertically to cause connector structure of the card component to enter into contact with connectors of a circuit board of the system. The camming surface can be configured and positioned such that connector structure along the edge of the card component progressively enters into electrical contact with electrical connectors of a circuit board of the system. The cartridge assembly includes a lock, for preventing accidental removal of the card component, which is activated and de-activated upon lateral motion of the lever. The holder includes an adjustable bracket system which can retain card components of different form factor (size of shape) on the holder.

37 Claims, 17 Drawing Sheets

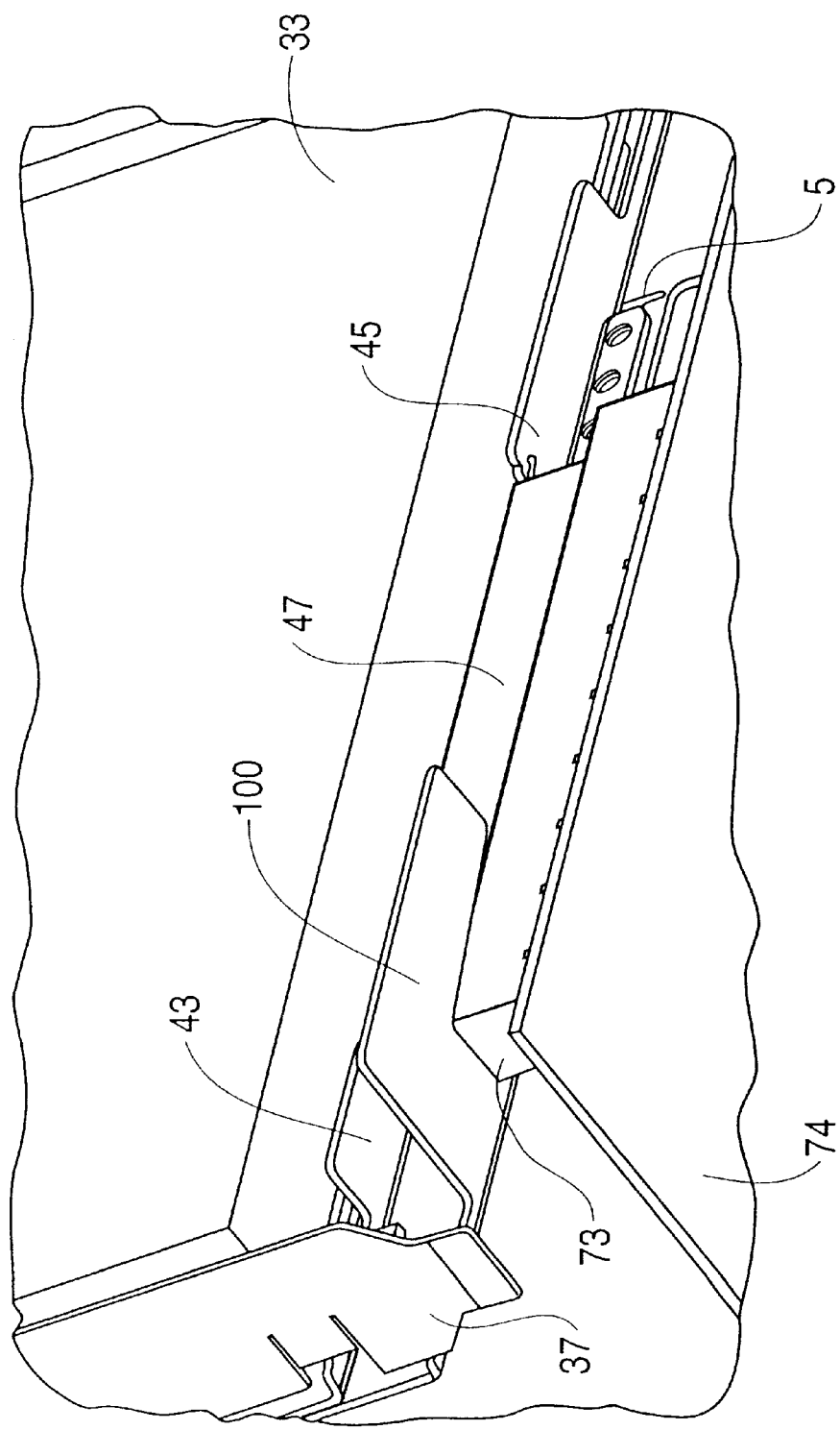

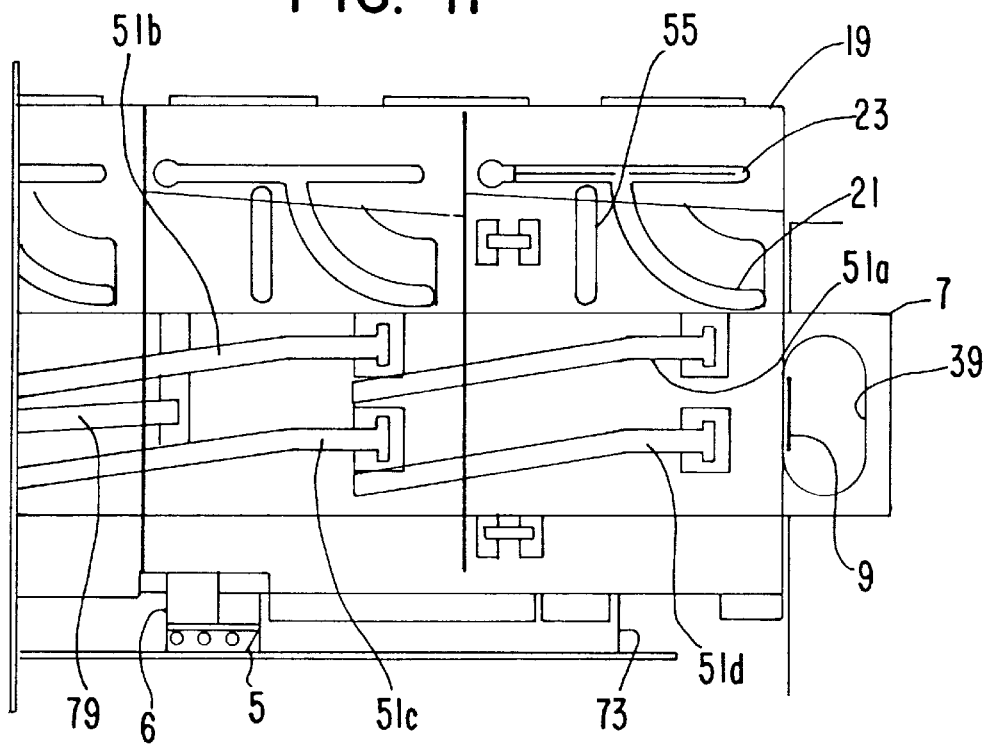
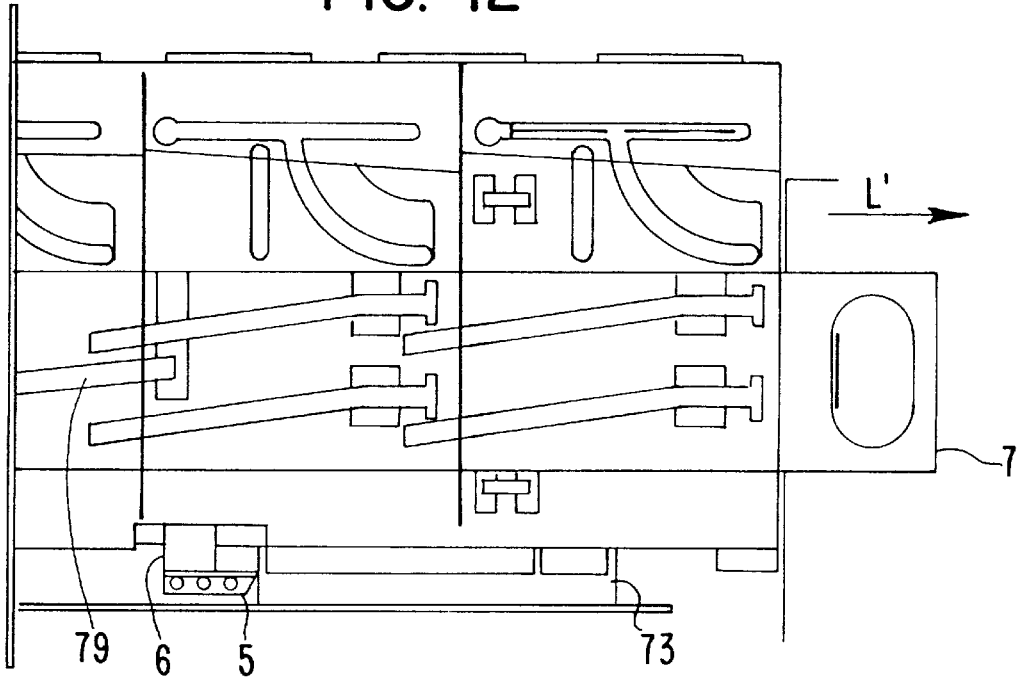

HOT PLUG CARTRIDGE ASSEMBLY

FIELD

The present invention is directed to a hot plug cartridge assembly, and methods of operating such assembly.

BACKGROUND

Modern computer systems, such as servers, workstations and personal computers, include cards that comply with the PCI (peripheral component interconnect) bus specification, the latest version of which is "PCI Local Bus Specification, Revision 2.1", set forth by the PCI Special Interest Group (SIG) on Jun. 1, 1995. Hereinafter, such cards in compliance with the PCI bus specification, that can be electrically connected to PCI busses complying with the PCI bus specification, are called PCI compliant cards.

Currently, there is known a top access hot plug structure, to engage/disengage PCI compliant cards with/from slots (connectors) therefor in the system (e.g., a computer), without powering down the system. This top access structure requires entry and removal of the PCI compliant card vertically, through the top of the, e.g., computer chassis or frame, e.g., at the input/output (I/O) bay. However, this structure has various disadvantages, including a requirement of an undue amount of space. Furthermore, since access is through the top of the frame, there cannot be stacked multiple computer structures on each other, and a drawer mechanism for engaging/disengaging PCI compliant cards with/from slots therefor in the system cannot be used.

Currently, there is no hot plug mechanism available in the market, which can be used to insert/remove PCI compliant cards horizontally, from a front or rear (or from sides) of the chassis.

Furthermore, at the present time PCI compliant cards have different form factors (e.g., different shapes and sizes, including (but not limited to) different heights). There is no system on the market which can be utilized to retain PCI compliant cards of different form factors, using a same assembly.

SUMMARY

The present invention, in various embodiments, includes a cartridge assembly. This cartridge assembly includes a carrier, a holder for supporting a card component, and a lever. The carrier, lever and holder have connecting structure which is adapted to connect both the holder and lever to the carrier. When the holder and the lever are connected to the carrier, each can move relative to the carrier. The lever has a camming surface and the carrier has a member adapted to follow this camming surface, the camming surface being configured and positioned such that lateral motion of the lever in a first direction causes displacement of the lever in a second direction different from the first direction. The lever and holder are adapted to be connected to each other such that displacement of the lever in the second direction causes movement of the holder in the second direction.

BRIEF DESCRIPTION OF THE DRAWINGS

FIG. 7 is a perspective view illustrating a card component connected to a slot (connectors) of a base board assembly in the input/output bay, according to an example and illustrative embodiment of the present invention.

FIG. 8b is a perspective view illustrating connection of the lever and holder to the carrier using an alternative embodiment of the holder, while

FIGS. 11–14 are side views for illustrating operation of the lock and lock extension, and operation of extraction of the PCI card component from connectors therefor, upon lateral movement of the lever, according to an example and illustrative embodiment of the present invention.

DETAILED DESCRIPTION

Figure 1A:
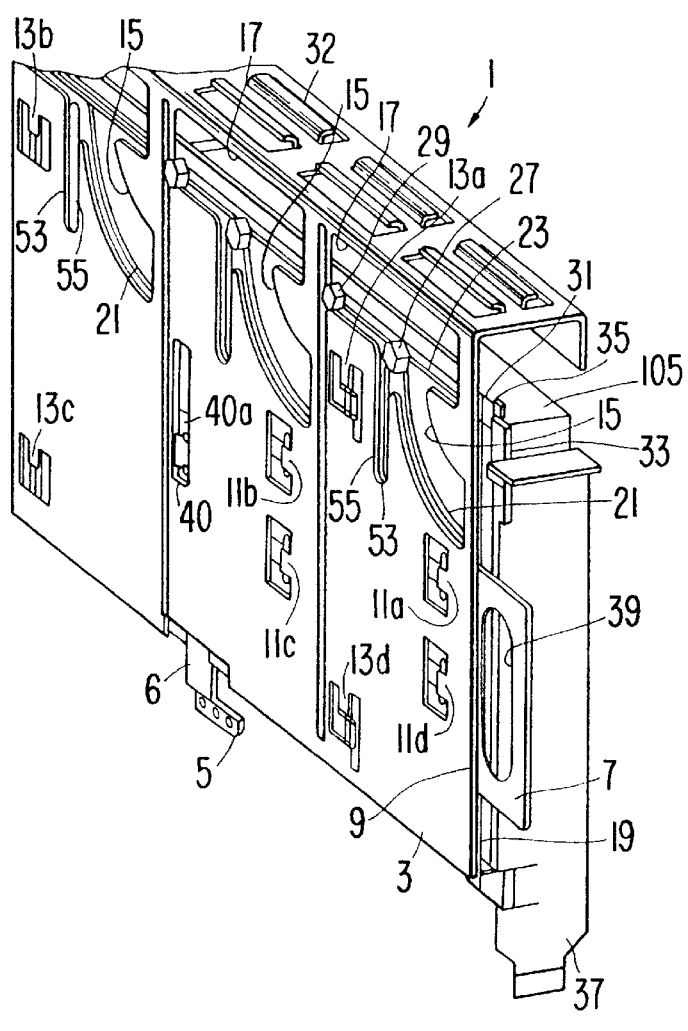
FIGS. 1a and 1b are perspective views of a cartridge assembly, of an example and illustrative embodiment of the present invention, containing a card component, with FIG. 1a being a view from a carrier side of the cartridge assembly, and FIG. 1b being a view from a side opposite the carrier side of the cartridge assembly.

While the invention will be described in connection with specific examples and illustrative embodiments, it will be understood that it is not intended to limit the invention to these described examples and illustrative embodiments. To the contrary, it is intended to cover all alterations, modifications and equivalents as may be included within the spirit and scope of the invention as defined by the appended claims.

Examples and illustrative embodiments of the present invention, in the following, are described in connection with the various drawing figures. Components, in the various drawing figures, having corresponding functions are referred to using common reference numerals.

Figure 1B:
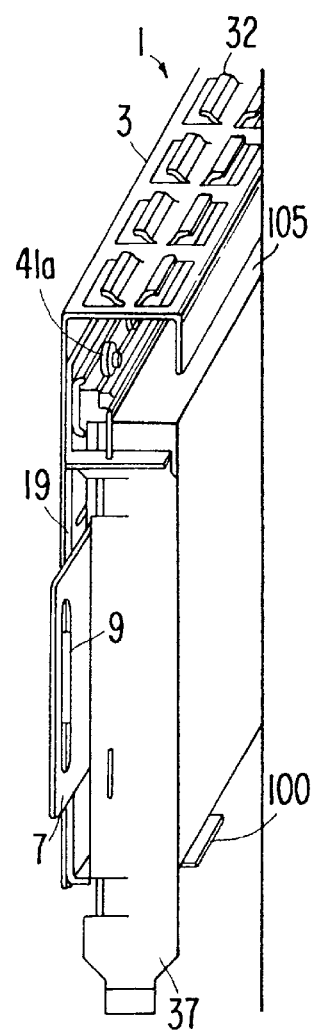

FIGS. 1a and 1b are perspective views showing cartridge assembly 1 according to an example and illustrative embodiment of the present invention. Cartridge assembly 1 includes carrier 3, holder 19 and lever 7. Holder 19 holds PCI compliant card 33. A volume, represented schematically by reference character 105, extends from one side of PCI compliant card 33, which volume can be occupied by electrical components of the electrical circuitry of PCI compliant card 33. In other words, volume 105 is set aside for components which extend outwardly from this one side of PCI compliant card 33. Lever 7 has an opening 39 at the exposed end thereof, to facilitate grasping of the lever for lateral movement thereof in direction L (see FIG. 5) or direction L' (see FIG. 12) opposite to direction L (directions L and L' constituting, together, a first direction). Lever 7 has a lip 9 thereon at opening 39, acting as a stop to prevent lever 7 from being pushed too far into the cartridge assembly 1.

Carrier 3, which desirably is made of sheet metal (for example, stainless sheet metal), but can suitably be made of metal or plastic, has elements 11a, 11b, 11c and 11d (e.g., pins or tabs) forming connecting structure to movably connect the lever 7 to the carrier 3, and elements 13a, 13b, 13c and 13d (e.g., pins or tabs) forming connecting structure to movably connect the holder 19 to the carrier 3. These elements 11a–11d and 13a–d of the carrier form, for example, tabs with a column portion and a large end portion (e.g., T-shaped tabs) fitting into keyhole-shaped (e.g., T-shaped) slots in the lever 7 (note, e.g., FIG. 17a) and keyhole-shaped (e.g., T-shaped) slots in the holder 19 (note, e.g., FIG. 15a), respectively, as seen in connection with FIGS. 4, 8a, 10, 15a and 17a, to connect holder 19 and lever 7 to the carrier. Desirably, where the carrier is made of sheet metal, elements 11a–d and 13a–d are punched from the sheet metal and bent so as to form suitable connecting structure for connecting the carrier to each of holder 19 and lever 7. However, alternate structure for elements 11a–d and 13a–d include keyhole standoffs or screws.

As can be appreciated from, e.g., FIGS. 1a and 1b, cartridge assembly 1 including carrier 3, holder 19 and lever 7, is thin, consisting of two layers (the first layer being the carrier 3 and the second layer being a single layer constituted by holder 19 and lever 7), with carrier 3 providing the base plane on which the second layer (holder 19 and lever 7) moves. Carrier 3 includes eight elements (e.g., pins) for connecting holder 19 and lever 7 to carrier 3, with four of the elements (11a–d) utilized for connecting to lever 7 and four elements (13a–d) through holder 19 (which holds PCI compliant card 33).

Also shown in FIG. 1a are elongated curved slots 15, elongated horizontal slots 17 and vertically extending elongated slots 53, in carrier 3, respectively exposing curved slots 21, horizontal slots 23 and vertically extending slots 55 in holder 19.

Figure 2:
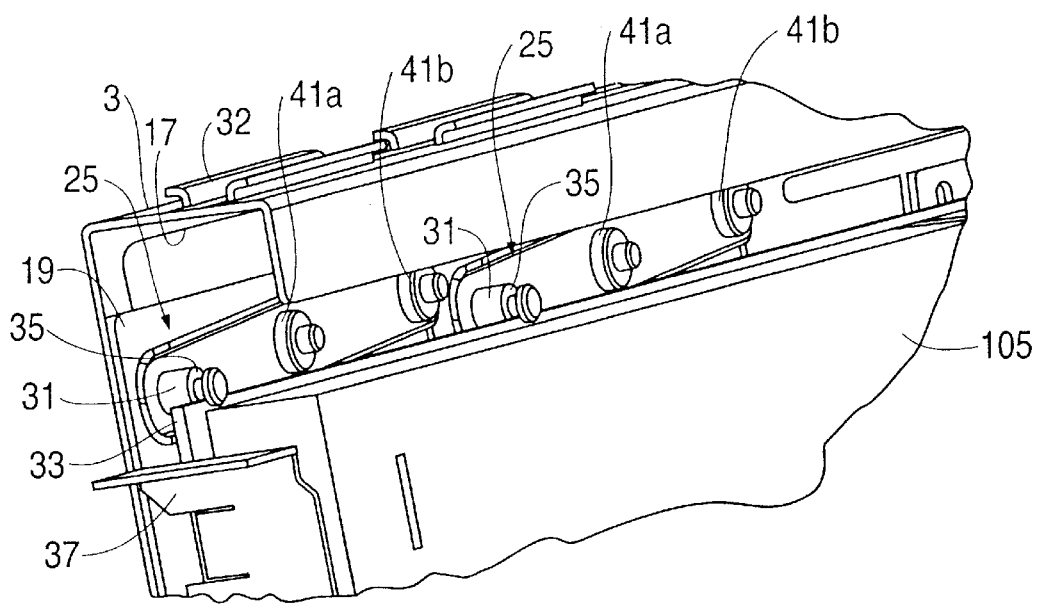
FIG. 2 is a perspective view illustrating a top edge attachment, by a bracket assembly, of a card component to a cartridge assembly, according to an example and illustrative embodiment of the present invention.

Slots 21, 23 and 55 in holder 19 hold bracket assembly 25 (see especially FIG. 2), bracket assembly 25 having structure both for fixing bracket assembly 25 to holder 19 and structure for holding the top end of PCI compliant card 33. Specifically, as shown in FIGS. 1a and 2, screws 27, 29 and nuts (such as PEM nuts, a stationary feature having female threads) 41a, 41b hold bracket assembly 25 to holder 19; while first element 31 of bracket assembly 25, having a groove 35, retains the top end of PCI compliant card 33. That is, the top end of PCI compliant card 33 fits within groove 35, whereby the top end of PCI compliant card 33 is retained thereby. As can be appreciated, screws 27, 29, and nuts (such as PEM nuts) 41a, 41b holding bracket assembly 25 to holder 19, can be adjustably positioned along curved slots 21 in holder 19, and horizontal or vertically extending slots 23 and 55, in holder 19, to adjust the position of first element 31 of bracket assembly 25 with respect to PCI compliant card 33. Accordingly, positioning of first element 31 of bracket assembly 25 can be adjusted relative to PCI compliant card 33 (for example, can be adjusted in the height direction of PCI compliant card 33), to accommodate cards of different form factors. For example, such bracket assembly 25 can accommodate mounting of PCI compliant cards 33 having a height in the range from 1.46 inches to 4.2 inches. In addition, through use of bracket assembly 25 and slots 21, 23 and 55, in holder 19, a same point position on the top-edge of PCI compliant card 33 can be supported throughout an entire adjustment range. In addition, use of groove 35 in first element 31 provides a simple and effective technique for holding the top edge of PCI compliant card 33.

Figure 15A:
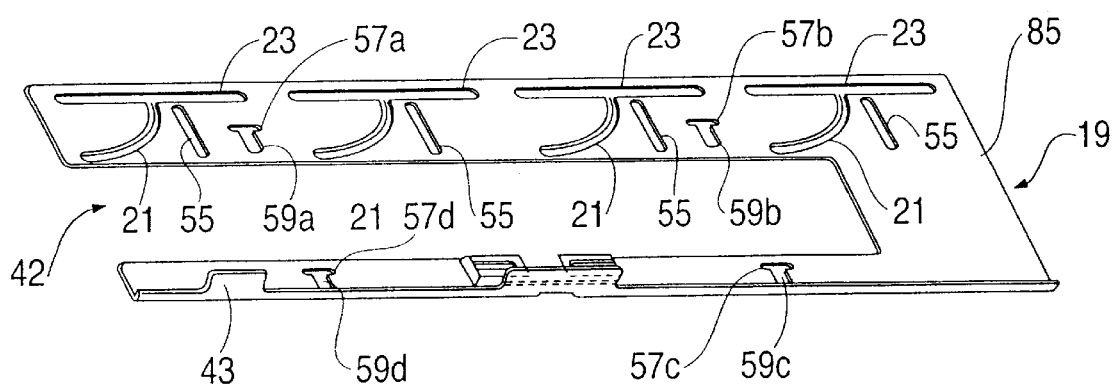
FIG. 15a is a perspective view of a holder of the cartridge assembly according to an example and illustrative embodiment of the present invention.

Cartridge assembly 1 includes up to four bracket assemblies 25, which would each have the above-discussed structure, thereby securely holding the top end of PCI compliant card 33. FIG. 15a shows locations on holder 19 for respectively holding four bracket assemblies 25.

Elongated curved slots 15, horizontal slots 17 and vertical slots 53 in carrier 3, corresponding to curved slots 21, horizontal slots 23 and vertically extending slots 55 in holder 19, are much larger than the slots in the holder in order to provide clearance for screws 27, 29, and accommodate movement of the bracket assembly with the lever, in the vertical direction, relative to carrier 3.

Also shown in FIGS. 1a and b is L-shaped bracket 37 attached to PCI compliant card 33, as suitable in the art.

Figure 10:
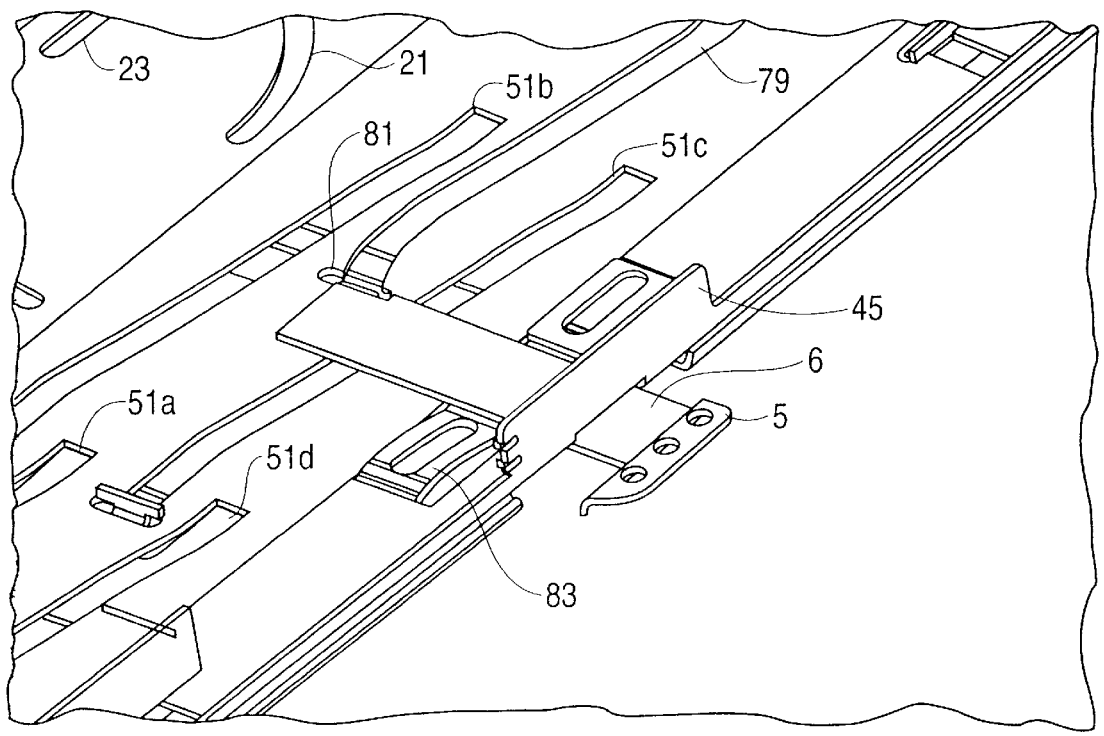
FIG. 10 is a perspective view illustrating a lock and lock extension according to an aspect of the present invention, just prior to being snap-fit into final position in the cartridge assembly according to an example and illustrative embodiment of the present invention.

Additional structure shown in FIG. 1a, and shown in further detail in FIG. 10, is lock 5 and lock extension 6. A protruding structure 40a (see FIG. 4) from lock extension 6 fits in elongated opening 40 in the carrier 3, for restricting lock 5 and lock extension 6 from moving laterally.

Shown in FIG. 1b is nut (e.g., PEM nut) 41a, which operates together with screw 27 for holding bracket assembly 25 on holder 19. FIG. 2 shows nut 41a, and nut (e.g., PEM nut) 41b cooperating with screw 29 (see FIG. 1a) as another element fixing bracket assembly 25 on holder 19. Through use of screws 27, 29 and their associated nuts 41a, 41b, bracket assembly 25 can easily and securely be held on holder 19.

Also shown in FIG. 1b is member 100 of carrier 3. This member 100 (shown also in FIG. 7, as well as in FIGS. 8a–c)

is an index feature of cartridge assembly 1, to locate cartridge assembly 1 relative to base board connectors 73 (for example, a set of base board connectors, see especially FIG. 7).

Each of FIGS. 1a and 1b also shows hanger flanges 32, desirably punched from sheet metal of carrier 3. These hanger flanges 32 cooperate with complementary flange structure 67 on the inside of top 65 of housing 63 of the input/output bay of the computer (see FIGS. 5 and 6), to guide and mount securely each cartridge assembly 1 respectively from the inside of top 65 of housing 63 of the input/output bay.

Figure 17B:
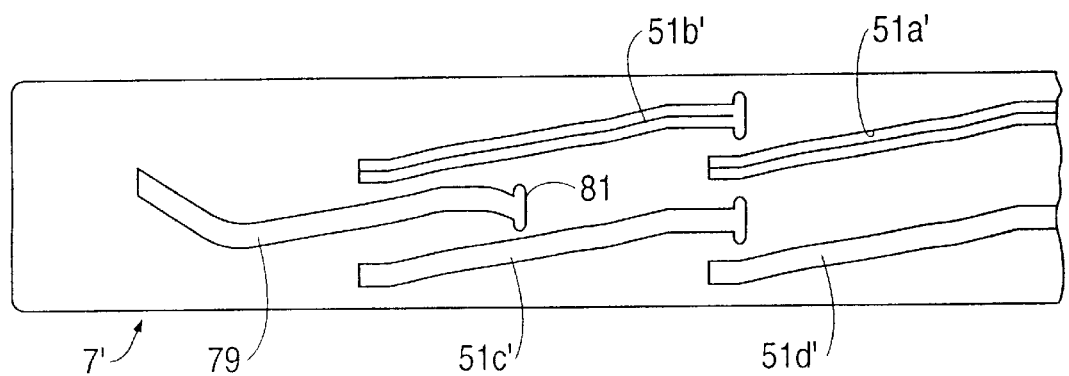
FIG. 17b is a partial side view of an alternative embodiment of the lever according to another example and illustrative embodiment of the present invention.
Figure 17A:
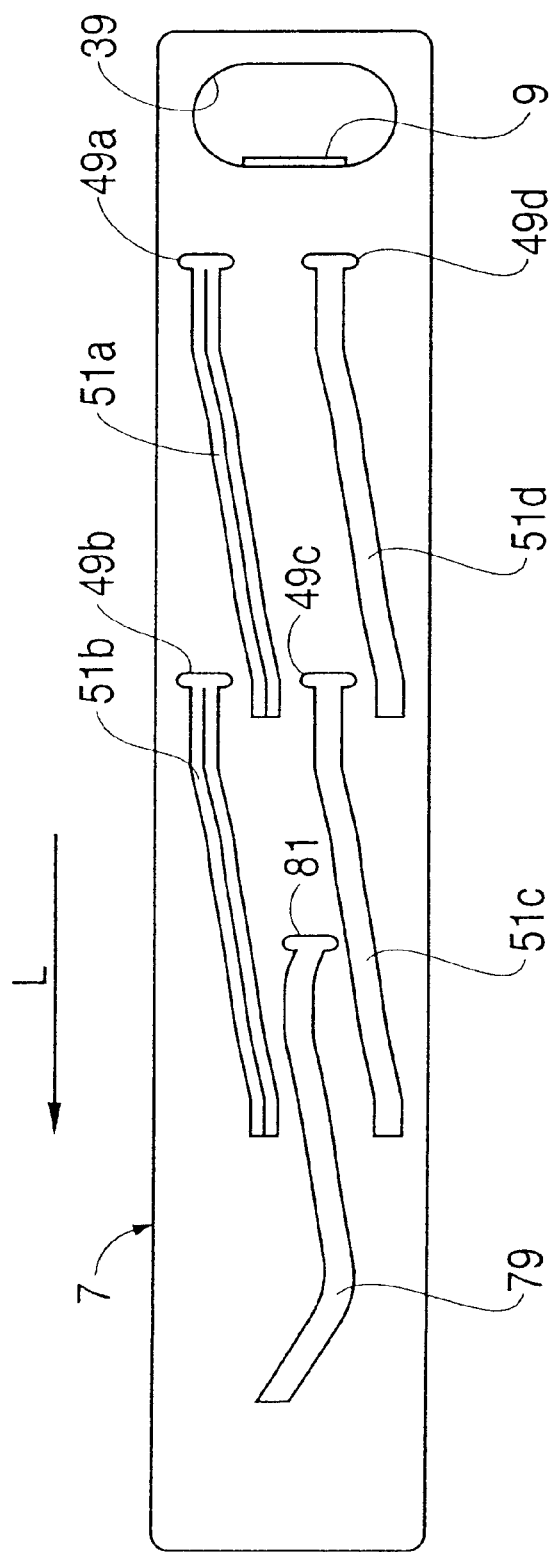
FIG. 17a is a side view of a lever according to an example and illustrative embodiment of the present invention.

Lever 7 is shown with more detail in FIG. 17a. Shown are slots 51a, 51b, 51c and 51d respectively receiving elements 11a, 11b, 11c and 11d of carrier 3 for connecting lever 7 to carrier 3. Slots 51a–d also form the camming surface. Thus, elements 11a–d and slots 51a–d act both to connect carrier 3 and lever 7, and to cause relative vertical movement between lever 7 and carrier 3, when lever 7 moves in direction L or a direction opposite thereto (L').

Also shown in FIG. 17a is slot 79, which forms a camming surface for lock 5 and lock extension 6 such that when lever 7 is moved laterally in direction "L" then lock 5 and lock extension 6 are activated and when lever 7 is moved laterally in the direction opposite to "L" then lock 5 is de-activated, due to vertical movement of lock 5 and lock extension 6 based upon lock 5 and lock extension 6 following the camming surface of slot 79.

Slots 51a, 51b, 51c and 51d respectively have keyhole-shaped (e.g., T-shaped) openings 49a, 49b, 49c and 49d at one end thereof, to facilitate connection of elements 11a–d, respectively, thereto, and to facilitate removal of these elements 11a–d therefrom (and, correspondingly, removal of lever 7 from carrier 3). Similarly, slot 79 has keyhole-shaped (e.g., T-shaped) opening 81 at one end thereof, to facilitate connection and disconnection of lock 5 and its extension 6 to and from lever 7.

With the slot configuration and positioning shown in FIG. 17a, the lever 7 (and, correspondingly, holder 19 and PCI compliant card 33 held thereby) remains horizontal as the lever 7 moves laterally in direction L or L'. In an alternative, preferred configuration and positioning for the slots forming the camming surface of the lever, these slots are configured and positioned such that as the lever is moved laterally in direction L or the direction opposite thereto (L'), the lever (and, correspondingly, the holder and the card component held thereby) does not remain horizontal during its vertical movement relative to carrier 3. Rather, upon movement of the lever direction L', from its position furthest into carrier 3, one end of the lever tilts upward upon initial lateral movement of the lever, and upon continued lateral motion of the lever the other end of the lever moves upward a greater distance such that the lever again becomes horizontal. Moreover, upon initial movement of the lever in direction L, from a position where the lever is extracted from carrier 3, the other end of the lever (and, correspondingly, the other end of the holder and of the card component held thereby) tilts downward, and upon continued motion of the lever in direction L the one end moves downward a greater distance than the other end such that the card component, at its lowest position, is horizontal.

Figure 20:
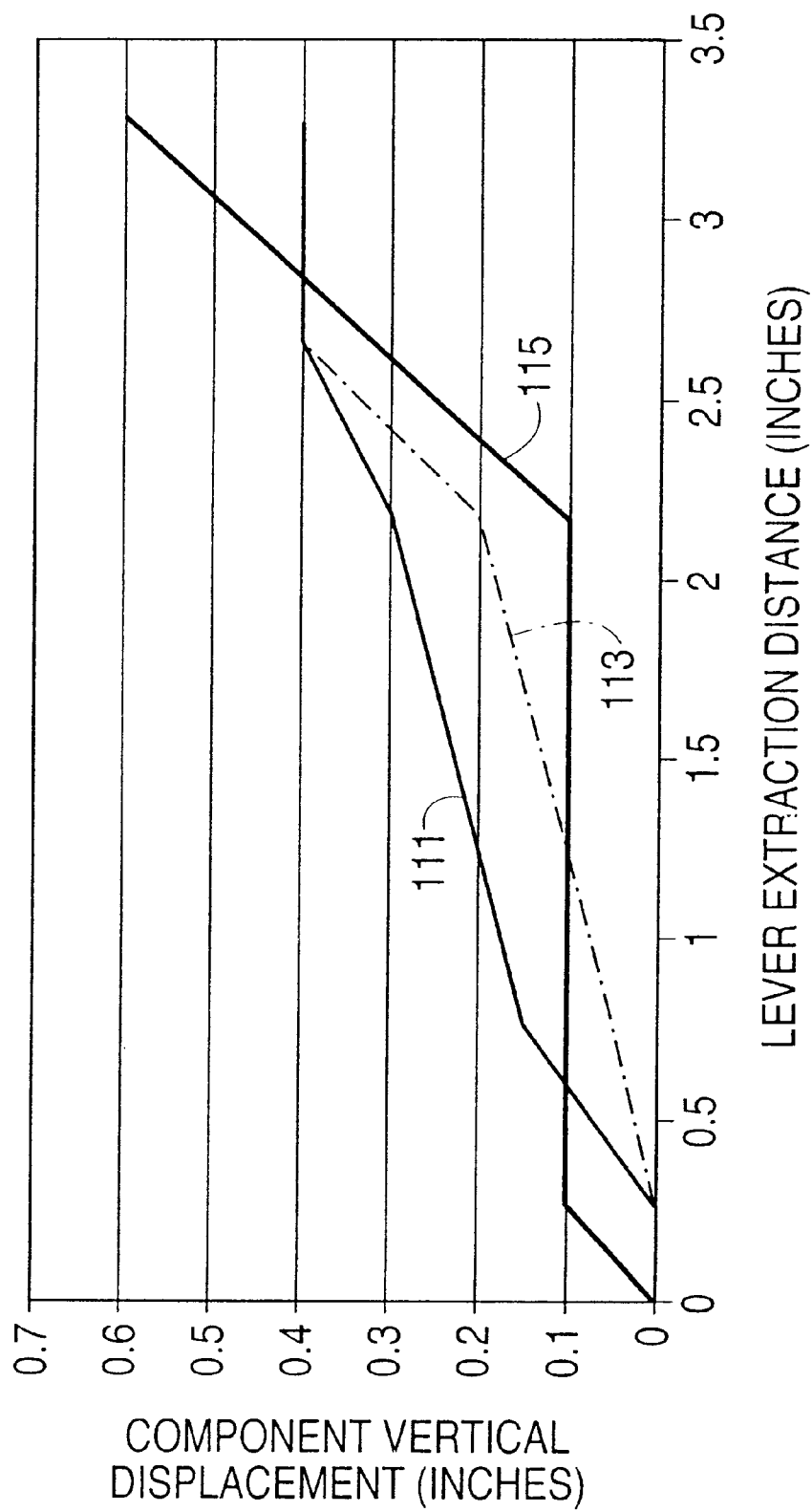
FIG. 20 is a graph showing card component vertical displacement as a function of lever extraction distance, for an example and illustrative embodiment of the present invention wherein the card component progressively enters into contact with the connectors therefor during vertical movement of the card component.

In the following, reference is made to FIGS. 17b and 20. FIG. 17b shows configuration and positioning of slots of lever 7'; and FIG. 20 shows displacement of front and back ends of a PCI compliant card 33 upon extraction of lever 7' in direction L', from a lever position within carrier 3. In FIG. 20, lines 111, 113 and 115 respectively show vertical displacement of the front and back ends of the PCI compliant card, and vertical displacement of lock 5, upon lateral motion of lever 7' in direction L'. The front end of PCI compliant card 33 is the end that first enters housing 63 of the input/output bay, and the back end of PCI compliant card 33 is the end exposed from housing 63. With the configuration and positioning of slots 51a', 51b', 51c' and 51d' shown in FIG. 17b, upon initial lateral motion of lever 7' in the direction L' (that is, extraction of the lever 7'), the front end of lever 7' (that is, the end of lever 7' furthest into housing 63) tilts upward, and upon continued lateral motion of lever 7 the back end of lever 7 (the end of lever 7 exposed from carrier 3) moves upward a greater distance than the front end such that the lever again becomes horizontal. Lever 7' (and, correspondingly, holder 19 and PCI compliant card 33) goes through a rotational movement as lever 7' is given a lateral motion in the direction L', due to the configuration and positioning of slots (camming surfaces) 51a', 51b', 51c' and 51d'.

Lever 7', and, correspondingly, holder 19 and PCI compliant card 33 held by holder 19, moves as follows upon lateral motion of lever 7' in direction L, from a position where lever 7' is extracted from the carrier 3. Initially, the back end of lever 7' tilts downward, moving into connectors 73; upon continued lateral motion of lever 7' in direction L, the front end catches up with the vertical downward movement of the back end, such that at the end of lateral motion of lever 7' PCI compliant card 33 is horizontal, in connectors 73. This movement of PCI compliant card 33, providing progressive entry of connectors 47 of PCI compliant card 33 into connectors 73 of base board 74, has the desirable result of requiring less force on lever 7' to cause connectors 47 of PCI compliant card 33 to be fully inserted into connectors 73, than if the lever remained horizontal during its lateral motion such that holder 19 and its PCI compliant card 33 also remained horizontal and all of connectors 47 engaged with connectors 73 at the same time.

One embodiment of holder 19 is shown with more detail in FIG. 15a. In FIG. 15a, holder 19 includes main body 85, which is U-shaped. The open end of the "U" is located, with respect to the carrier 3 and lever 7, when lever 7 and holder 19 are connected to carrier 3, at the location where lever 7 enters holder 19. That is, the lever 7 fits within the opening 42 of the U-shaped main body 85 of the holder 19. Thus, lever 7 can be moved laterally in the directions L and L' (see FIGS. 5 and 12, respectively, for "L" and "L'") within opening 42 of holder 19.

Figure 15B:
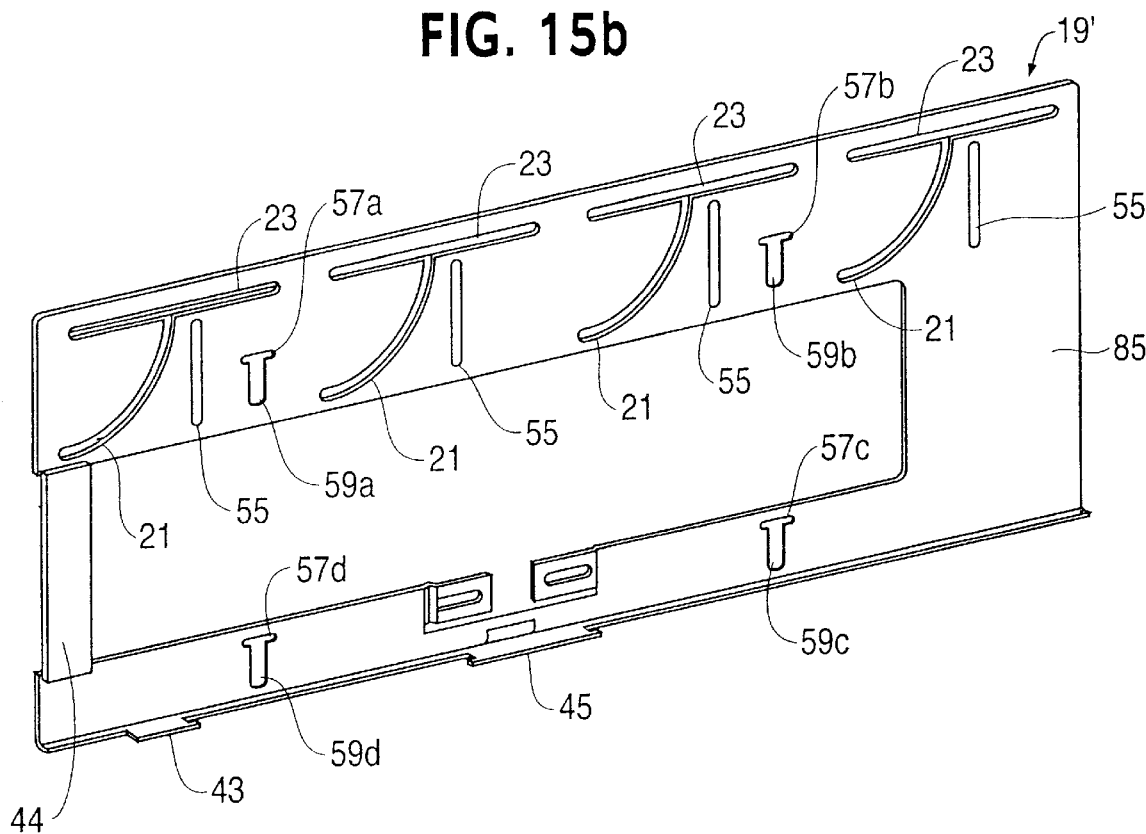
FIG. 15b is a perspective view of a holder according to an alternative example and illustrative embodiment.

A preferred structure for the holder according to an aspect of the present invention is shown in FIG. 15b. The structure of FIG. 15b differs from that of FIG. 15a, in that holder 19' has bar 44 bridging across the open end of U-shaped main body 85. Bar 44, attached to the legs of U-shaped main body 85, provides rigidity to holder 19'.

Shown in FIGS. 15a and 15b are slots 59a, 59b, 59c and 59d of holder 19 (19'). These slots 59a, 59b, 59c and 59d respectively receive elements 13a, 13b, 13c and 13d of carrier 3, for connecting holder 19 (19') to carrier 3. As can be appreciated, through the combination of slots 59a–59d with elements 13a–13d, movement of holder 19 (19') can be restricted to the vertical direction, notwithstanding lateral movement of lever 7 within opening 42 of main body 85 of holder 19 (19').

Slots 59a–59d have T-shaped openings 57a–57d, respectively, at tops of the slots; these T-shaped openings 57a–57d facilitate entry of elements 13a–13d of carrier 3, forming the connecting structure, to holder 19, these elements 13a–d desirably being T-shaped features to easily permit snap-fit connection of carrier 3 to holder 19.

Figure 3:
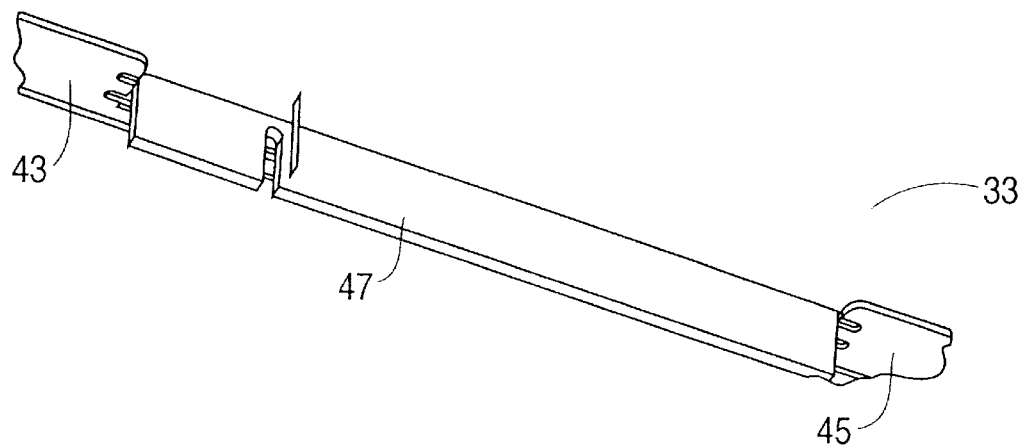
FIG. 3 is a perspective view illustrating a bottom edge attachment of a card component to a cartridge assembly, according to an example and illustrative embodiment of the present invention.

As seen in FIG. 3, and also shown in FIG. 7, holder 19 includes members 43, 45 supporting the bottom of PCI compliant card 33, with connectors 47 of PCI compliant card 33 extending below members 43, 45 when PCI compliant card 33 is positioned in holder 19.

Figure 4:
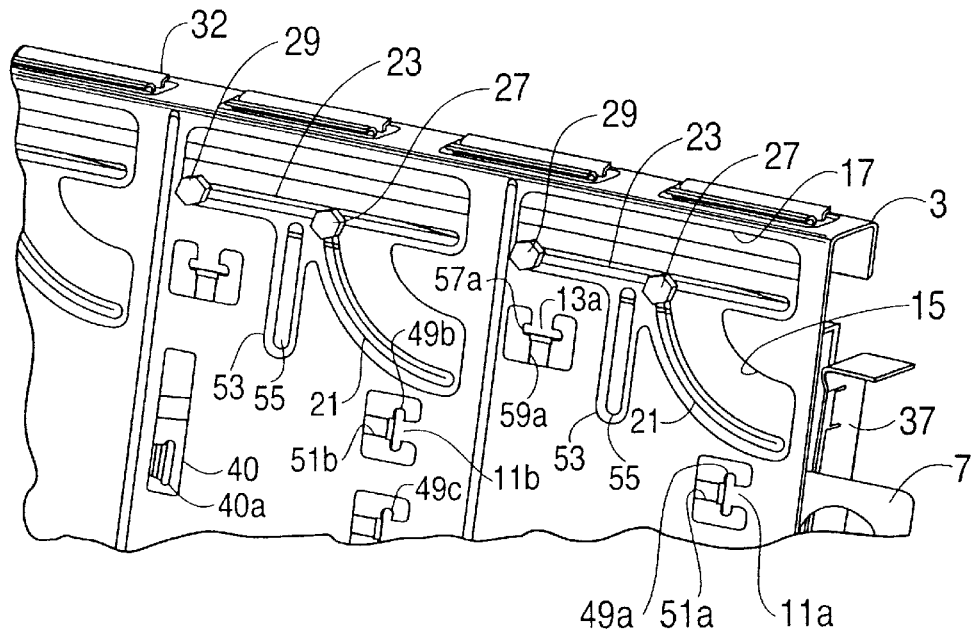
FIG. 4 is a perspective view illustrating an adjustment mechanism for holding card components of different form factors by a holder, according to an example and illustrative embodiment of the present invention.
Figure 5:
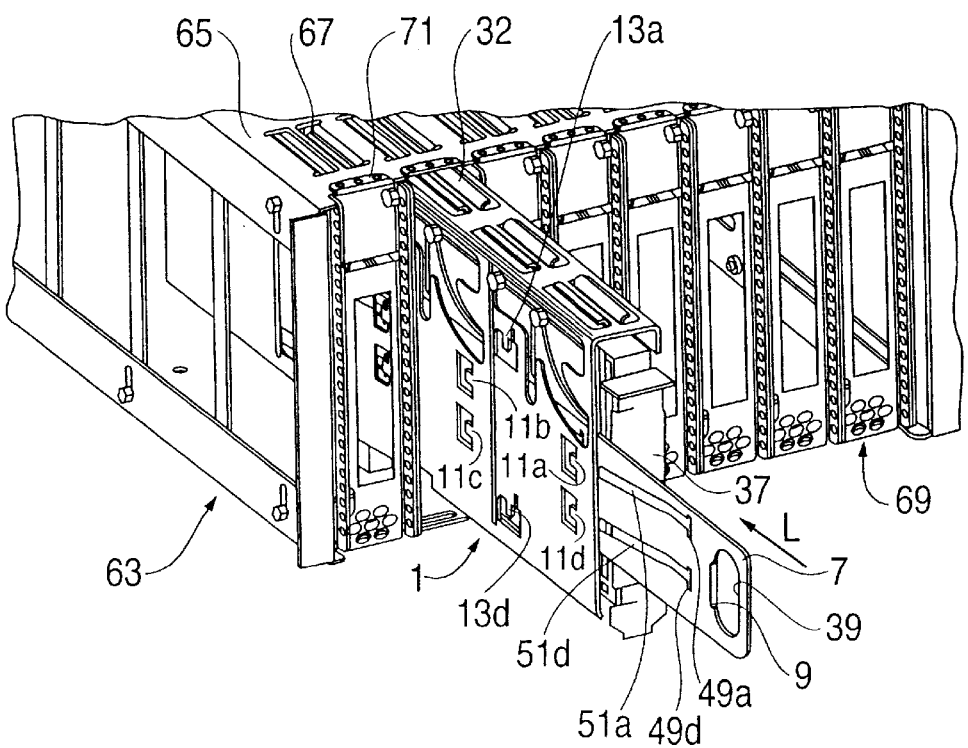
FIG. 5 is a perspective view illustrating a cartridge assembly, according to an example and illustrative embodiment of the present invention, partially inserted into the housing of an input/output bay for the card component.

FIG. 4 shows, in greater detail, a portion of cartridge assembly 1 shown in FIG. 1a. FIG. 4 shows relationships between slots in lever 7 and holder 19 and connecting structure (elements) in carrier 3. Specifically, FIG. 4 shows elements 11a, 11b and 11c (element 11d is shown in FIGS. 1a and 5) of carrier 3 forming the connecting structure to lever 7. Also shown in FIG. 4 are slots 51a, 51b and 51c which form a linear camming surface of lever 7. Slots 51a, 51b and 51c (as well as slot 51d, shown in FIGS. 5 and 17a) respectively end in T-shaped openings 49a, 49b and 49c (and, as shown in FIGS. 5 and 17a, 49d), to facilitate entry and removal of elements 11a–11d, respectively, into and from the respective slots 51a–51d.

Introduction of cartridge assembly 1, according to an illustrative example of the present invention, into housing 63 of the input/output bay of a computer, can be seen in FIG. 5. Thus, initially lever 7 is at a position extending outward from carrier 3. At this position, due to the location of elements 11a–11d on linear camming surfaces 51a–51d, lever 7, and correspondingly, holder 19 and PCI compliant card 33 held thereby, are at a relatively high position in the cartridge assembly. Hanger flanges 32 of cartridge assembly 1 are slid along and retained by complementary flange structure 67 extending from the inside of top 65 of housing 63 of the input/output bay, so as to retain cartridge assembly 1 supported by flange structure 67. Cartridge assembly 1 has suitable indexing structure element 100 (see FIGS. 1b and 7, for example) to properly locate cartridge assembly 1 in its insertion into housing 63 of the input/output bay and in greater detail to align connector 47 of PCI compliant card to baseboard connector 73, as shown in FIG. 7.

Thereafter, lever 7 is moved laterally in direction L, whereby movement of elements 11a–11d relative to slots 51a–51d, respectively, which constitute linear camming surfaces, force lever 7 and holder 19 vertically downward, thereby lowering PCI compliant card 33 vertically downward to its proper final location in, e.g., connectors 73 (see FIGS. 6 and 7) of base board 74.

Similarly, upon moving lever 7 laterally in direction L', opposite to L, lever 7 is forced to move vertically upward, thereby forcing holder 19 and PCI compliant card 33 held thereby upward, so that cartridge assembly 1 can be removed from the housing 63 of the input/output bay.

Next will be described the movement of lever 7', holder 19 and PCI compliant card 33 when using lever 7' having slots 51a', 51b', 51c' and 51d', shown in FIG. 17b. Upon moving lever 7' laterally in direction L, initially the back end of lever 7' (and, correspondingly, the back end of holder 19 and PCI compliant card 33) tilts downward, and rearmost connectors, of connectors 47 of PCI compliant card 33, come into contact with connectors 73 of base board 74. Upon continued motion of lever 7' laterally in direction L, the front end of lever 7' moves downward a larger distance than the back end; and, correspondingly, front ends of holder 19 and PCI compliant card 33 also move downward a larger distance than back ends thereof, so that the remainder of connectors 47 of PCI compliant card 33 can come into contact with connectors 73 of base board 74. Thus, connectors 47 of PCI compliant card 33 progressively come into contact with connectors 73 of base board 74. This progressive connection achieves the advantage that less force is required, in moving the lever 7', to cause contacts in connector 47 to engage connectors 73, as compared to the force required to move lever 7 (which is maintained horizontal) to cause all connectors 47 of PCI compliant card 33 associated therewith to come into contact simultaneously with connectors 73.

Similarly, lever 7', when moved in direction L', sequentially disengages connectors 47 from connectors 73 rather than simultaneously disengaging all contacts in connectors 47 from connectors 73, so that disengagement through use of lever 7' requires less force than through use of lever 7.

Figure 16:
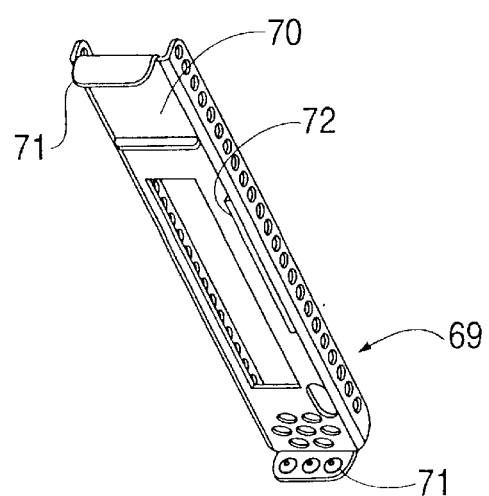
FIG. 16 is a perspective view of an EMI gate, according to an example and illustrative embodiment of the present invention.

Also shown in FIG. 5 is electromagnetic interference (EMI) gate 69. Desirably, and as shown in FIG. 5, there is an individual EMI gate 69 for each of the openings for introduction of a respective cartridge assembly. EMI gate 69 is shown by itself in FIG. 16, and includes main body 70, and flanges 71, 71 to fit (e.g., snap-fit) on housing 63 of the input/output bay for holding EMI gate 69 on housing 63 of the input/output bay. Gate 69 can be manually press-fit on housing 63, with flanges 71 fitting in slots or apertures in housing 63. Also shown in FIG. 16 is aperture 72 in EMI gate 69, to permit lever 7 to pass therethrough when the EMI gate is in position on housing 63 of the input/output bay and a cartridge assembly 1 is in its final position in the input/output bay.

Figure 19:
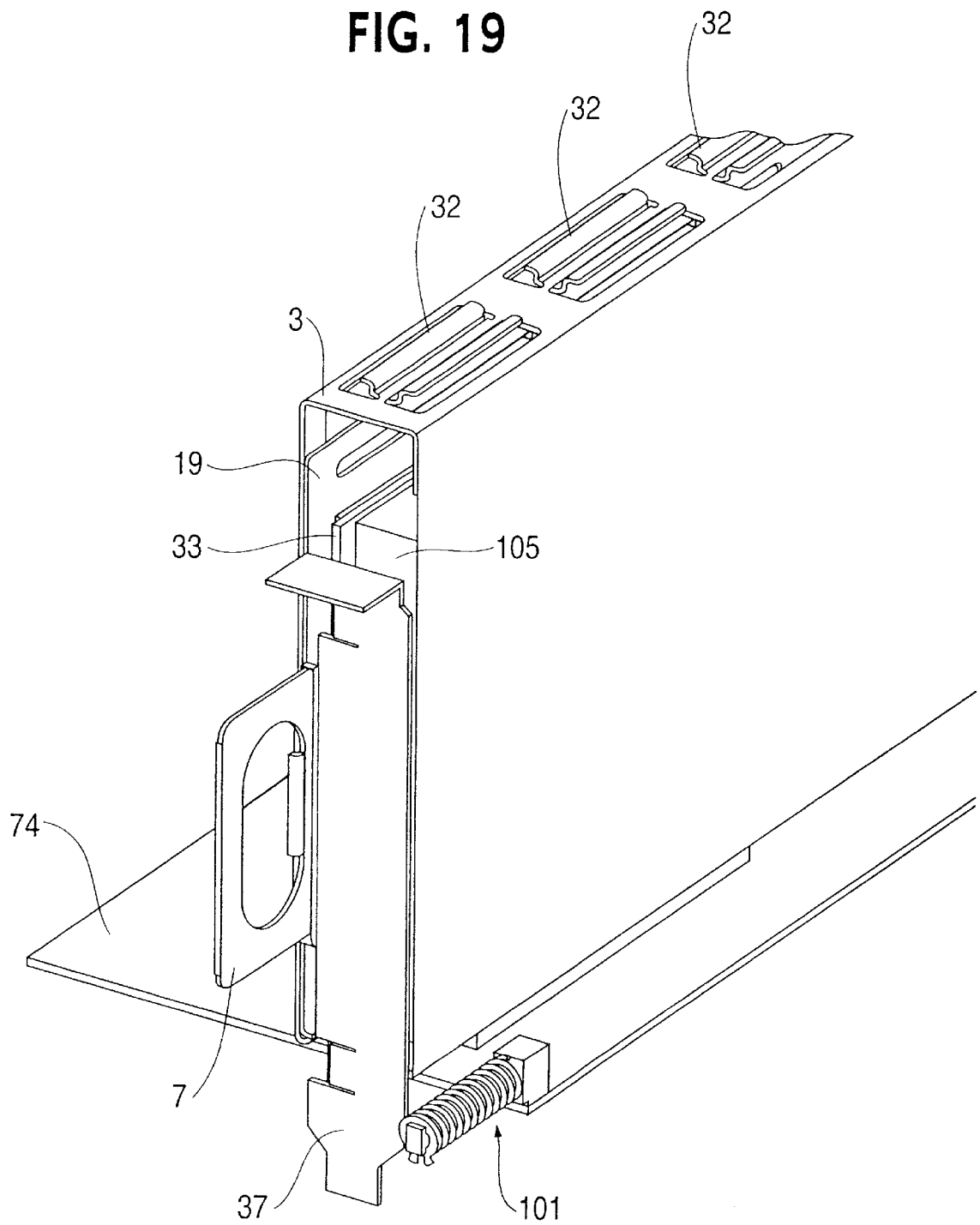
FIG. 19 is a perspective view of a cartridge assembly according to an example and illustrative embodiment of the present invention, showing an intrusion switch.

In an embodiment shown in FIG. 19, intrusion switch 101 is provided on base board 74 of the computer, for each EMI gate. Applying such EMI gate over the opening therefor in housing 63 will depress intrusion switch 101 to status a hot plug controller (e.g., initiate a power up sequence to the respective connectors 73 of base board 74). Correspondingly, removing EMI gate 69 opens intrusion switch 101 to initiate the power down sequence of the respective connectors 73 of base board 74. Thus, EMI gate 69 and cartridge assembly 1 can become an integrated system to alert or notify of removal of PCI compliant card 33.

EMI gate 69 can have a tab to grasp to facilitate removal from the housing, and due, e.g., to lip 9 of lever 7 EMI can be removed by moving lever 7 in direction L'.

Figure 6:
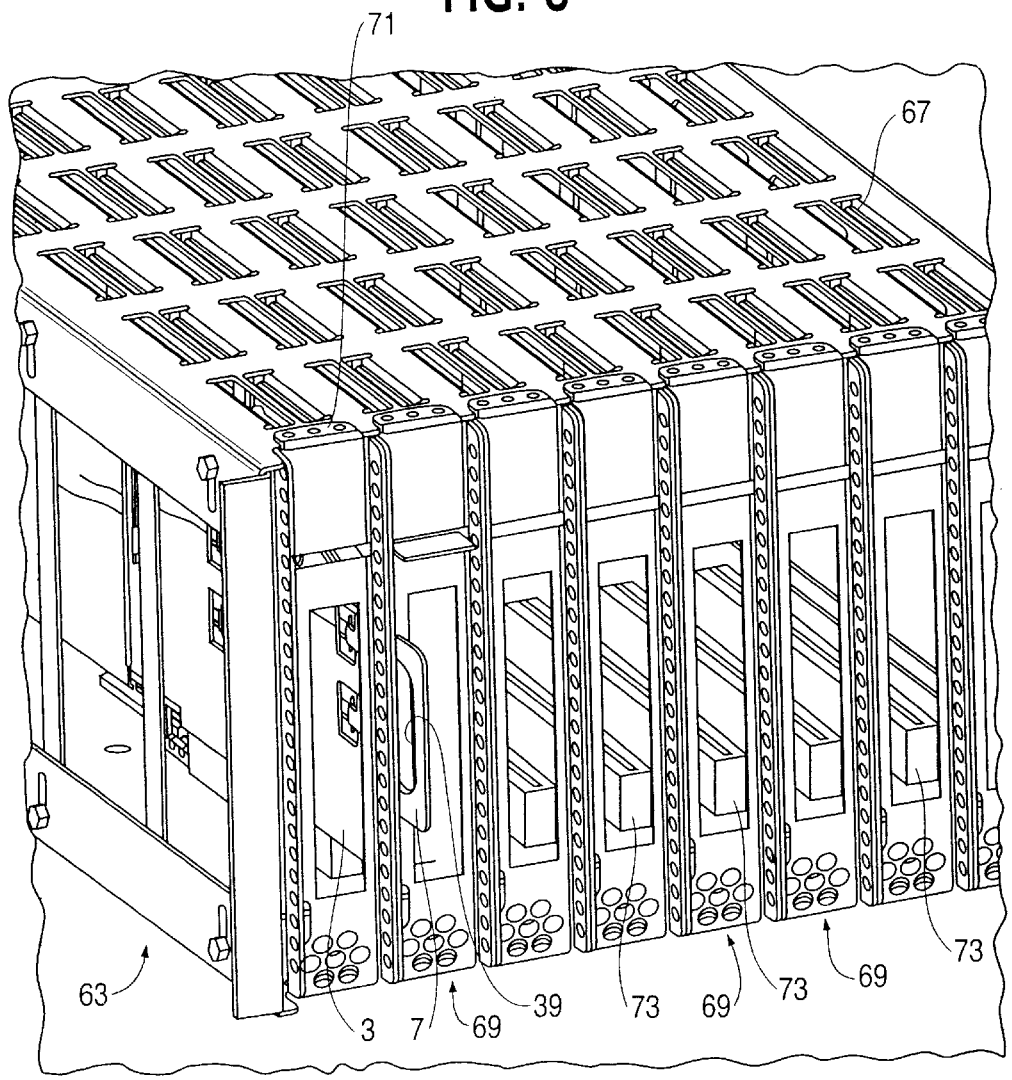
FIG. 6 is a perspective view illustrating the housing of an input/output bay for housing cartridge assemblies according to an example and illustrative embodiment of the present invention, with electromagnetic interference (EMI) gates in place.

FIG. 6 shows housing 63 of the input/output bay with EMI gates 69, 69, etc., in place, and with one cartridge assembly 1 provided and having lever 7 sticking out past EMI gate 69. Also shown in FIG. 6 are connectors 73 for each respective opening of housing 63 of the input/output bay. As can be appreciated, according to an illustrative aspect of the present invention wherein cartridge assembly 1 according to an embodiment of the present invention is used to introduce PCI compliant card 33, lowering of PCI compliant card 33 through use of lever 7 as part of cartridge assembly 1 electrically connects connectors 47 of PCI compliant card 33 with corresponding connectors 73 of base board 74 of the computer, as seen in FIG. 7.

Figure 8A:
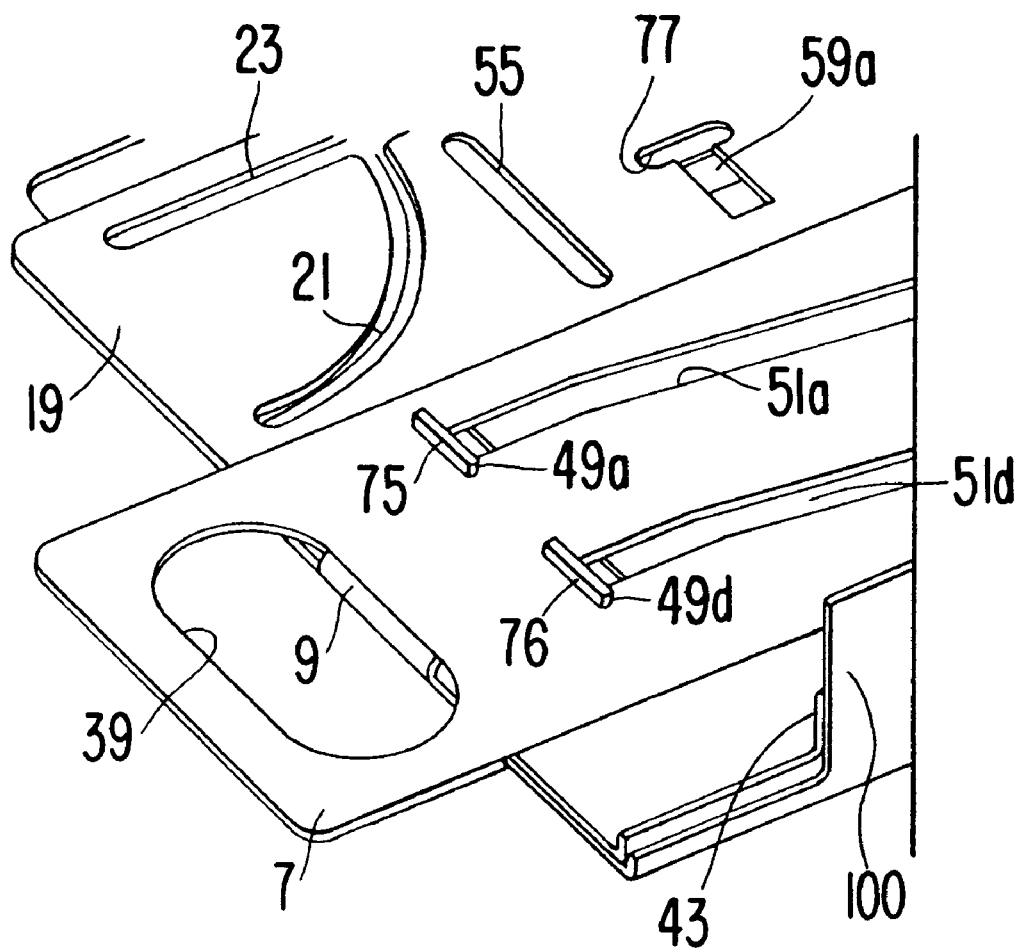
FIG. 8a is a perspective view illustrating connection of the lever and holder to the carrier according to an example and illustrative embodiment of the present invention.

FIG. 8a illustrates positioning of lever 7 in opening 42 of U-shaped main body 85 of holder 19, and connection of lever 7 to carrier 3, using one embodiment of holder 19 according to the present invention. Specifically, shown in FIG. 8a are members 75, 76 which constitute respectively end portions of elements 11a, 11d. Member 75 and the rest of element 11a forms a T-shaped structure; similarly, member 76 and the rest of element 11d forms a T-shaped structure, and corresponding members are provided for elements 11b and 11c as end portions, to form T-shaped structure. The T-shaped structure formed by element 11a and member 75 fits in T-shaped opening 49a in slot 51a of lever 7. Similarly, element 11d and member 76, and each of elements 11b and 11c and members corresponding to members 75, 76, form T-shaped structures, which respectively fit in T-shaped openings 49d, 49b and 49c in slots 51d, 51b and 51c. Through use of the T-shaped components and end openings, lever 7 and carrier 3 can easily be snap-fit together for proper connection therebetween.

Also shown in FIG. 8a is slot 59a of holder 19, with T-shaped structure 77 constituting an end portion of element 13a forming connecting structure to holder 19. Here also, the use of the T-shaped structure and T-shaped openings for the slots facilitates snap-fitting of holder 19 to carrier 3, providing a simple and efficient technique for the connection.

Figure 8B:
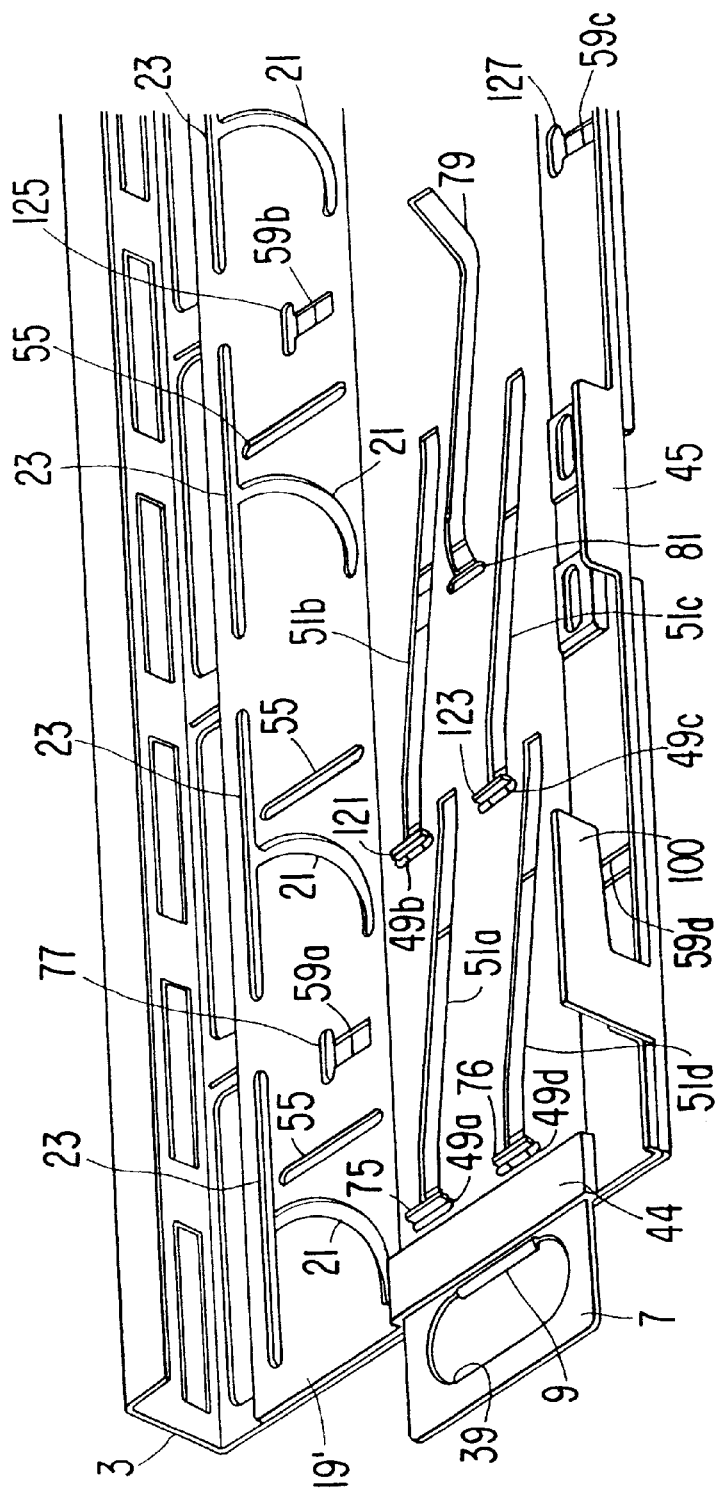
Figure 8C:
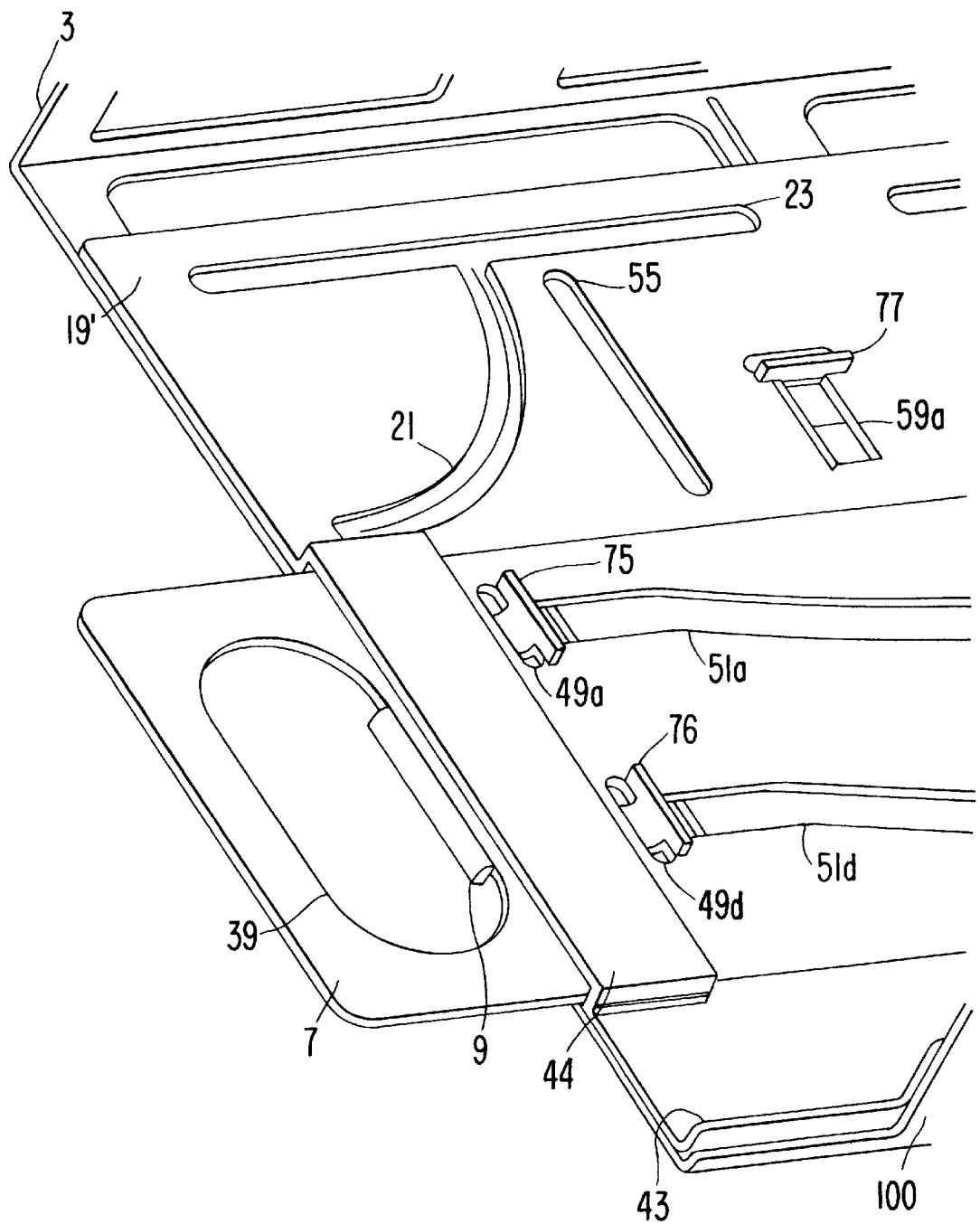
FIG. 8c is a more detailed perspective view of a part of this connection using the alternative embodiment of the holder.

FIGS. 8b and 8c illustrate positioning of lever 7 in the holder according to another aspect of the present invention, using holder 19' as shown in FIG. 15b. FIGS. 8b and 8c show bar 44 bridging across opening 42 of U-shaped main body 85 of holder 19'. Lever 7 extends into opening 42 beneath bar 44, and can move laterally. Also shown in FIG. 8b are members 121, 123, respectively forming end members of elements 11b and 11c, to form T-shaped structures to fit into slots 51b and 51c, respectively, in lever 7. Similarly, also shown in FIG. 8b are T-shaped structures 125, 127, respectively, forming end portions of elements 13b and 13c, to fit respectively into slots 59b, 59c in holder 19'. A corresponding T-shaped structure forming an end portion of element 13d, fits into slot 59d in holder 19'.

Figure 9:
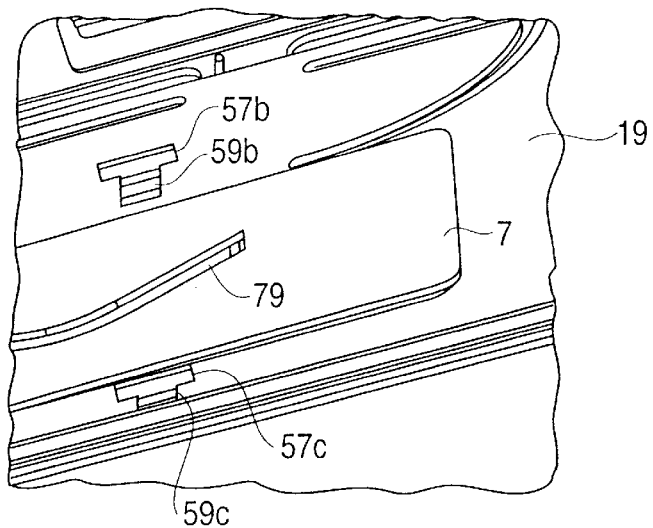
FIG. 9 is a perspective view illustrating positioning of the lever and holder just prior to snapping the lever into the holder, according to an example and illustrative embodiment of the present invention.

FIG. 9 shows positioning of lever 7, just prior to snapping lever 7 into its position relative to holder 19. Lever 7 can be snap-fit into the open area between the legs of main body 85 of holder 19.

As described previously in connection with FIG. 1a, according to another illustrative aspect of the present invention, lock 5 can be provided as part of cartridge assembly 1. Lock 5, when operating, is positioned adjacent an inner end of connectors 73, and prevents cartridge assembly 1 from being removed from housing 63 of the input/output bay until PCI compliant card 33 is fully extracted from base board connector 73. Referring to FIG. 10, shown is lock 5 and lock extension 6; lock extension 6 includes T-shaped protrusion 40a, shown in FIGS. 1a and 4. Protrusion 40a fits within slot 79 (shown in FIG. 17a) in lever 7, slot 79 providing a linear camming surface for lock 5. To facilitate entry of protrusion 40a into slot 79, slot 79 includes T-shaped opening 81 at the head thereof. Moreover, protrusion 40a passes through elongated opening 40 in carrier 3, to restrict movement of lock 5 to vertical movement notwithstanding lateral movement of lever 7.

FIG. 10 shows lock 5 and lock extension 6 positioned just before assembly into its position in cartridge assembly 1. In FIG. 10, flange 83 of holder 19 is deflected, and when lock 5 and lock extension 6 are positioned in cartridge assembly 1 then flange 83 will snap back to restrain lock extension 6 (and, consequently, lock 5) from lateral movement.

Figure 13:
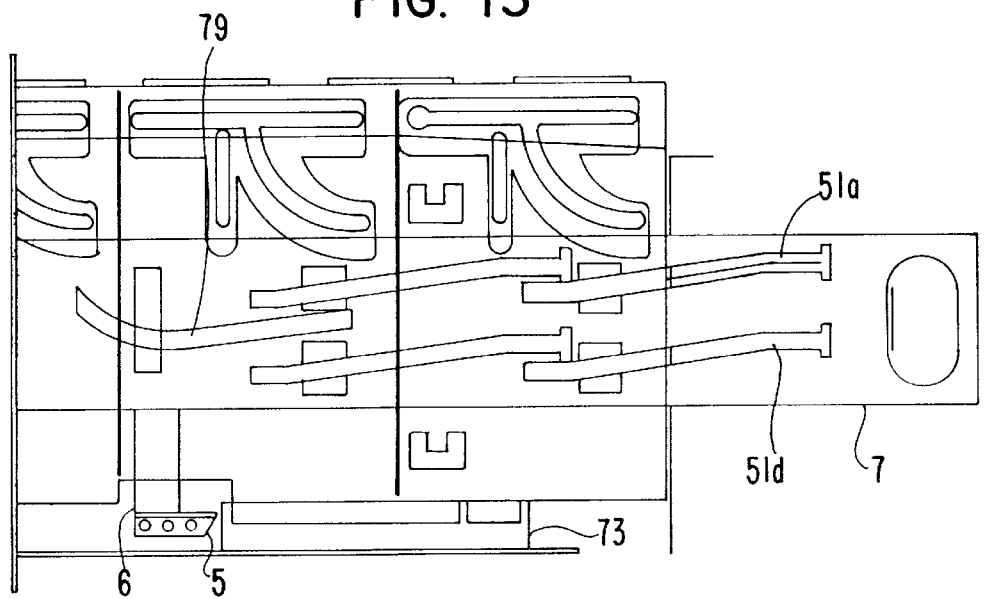
Figure 14:
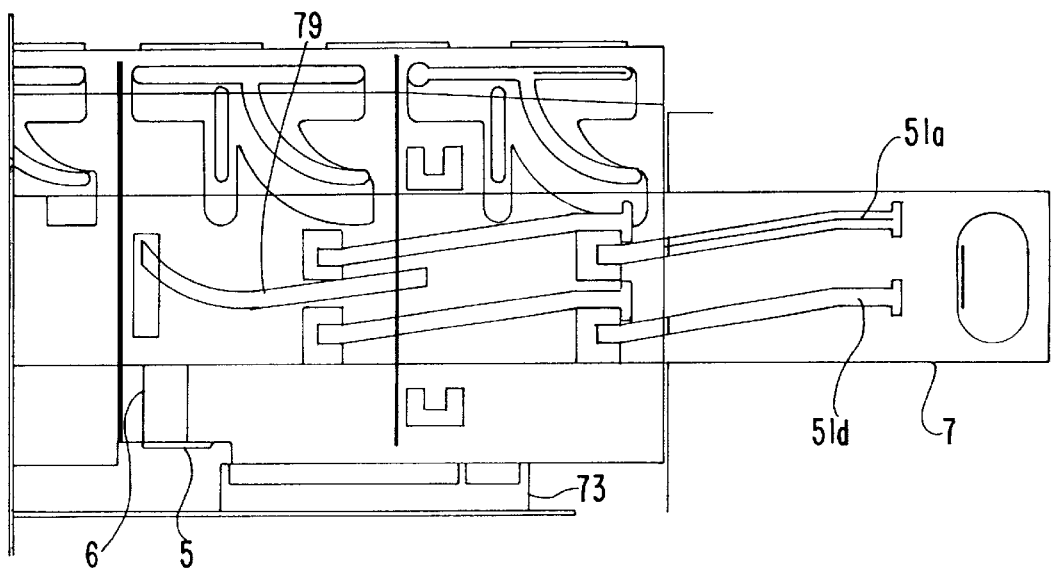

Operation of lock 5 can be seen in FIGS. 11–14. In FIG. 11, lever 7 is fully introduced into cartridge assembly 1, and lock 5 is extended to a lower position and positioned in the vicinity of the inner end of base board connectors 73. In FIG. 12, lever 7 has been moved 15% in direction L', and protrusion 40a is at a different position, correspondingly, along slot 79. In FIGS. 13 and 14, lever 7 respectively has been extracted 75% and 100%. As seen in FIG. 14, relative movement of protrusion 40a along the last, steeply sloped portion of slot 79 causes lock 5 to be retracted, so as to clear base board connectors 73, enabling removal of cartridge assembly 1.

Figure 18:
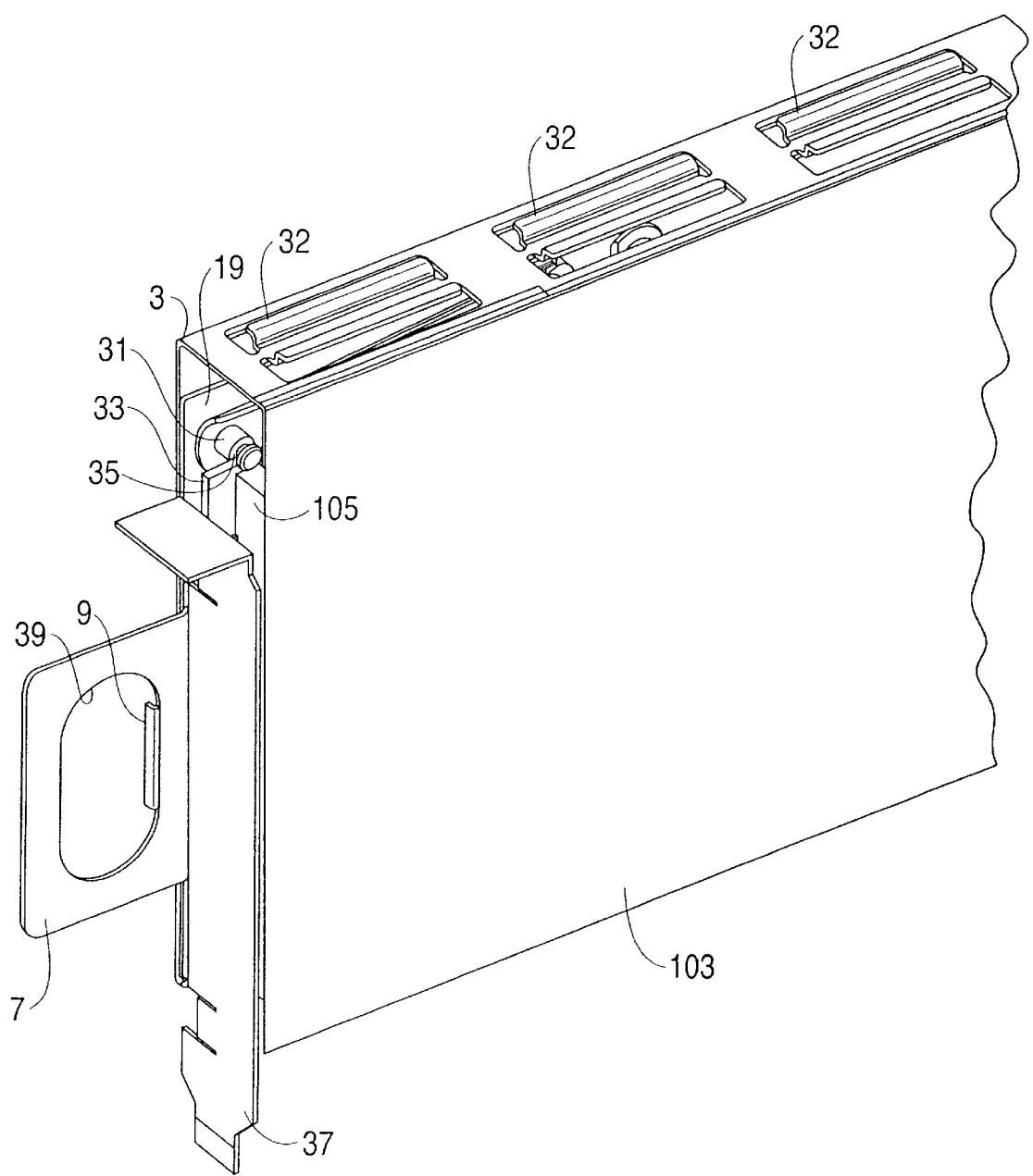
FIG. 18 is a perspective view of a cartridge assembly according to another example and illustrative embodiment of the present invention, having an insulating sheet.

Desirably, carrier 3 is made of sheet metal (for example, stainless sheet metal). This provides advantages that electromagnetic interference shielding is improved, and better thermal conductivity is achieved as compared to utilizing plastics for the carrier. In addition, by forming carrier 3 of sheet metal, it can be made of the same material as the housing of the input/out bay, and there is a high predictability of mechanical properties. Each of lever 7 and holder 19 can also be made of sheet metal. Moreover, lever 7 and holder 19 can be made of, e.g., plastic, in order to, desirably, smoothly move the lever and holder relative to the carrier and to provide insulation.

Where the carrier is made of sheet metal, according to a still further illustrative embodiment of the present invention a sheet of insulating material can desirably be applied to the surface of the carrier facing an adjacent cartridge assembly, to electrically insulate the cartridge assembly from the adjacent cartridge assembly. Illustratively, and not to be limiting, the insulating material of this sheet can be, e.g., "Mylar", applied to the carrier, this "Mylar" sheet having a pressure sensitive adhesive strip to allow adhesion to the carrier. FIG. 18 shows insulating sheet 103 attached to carrier 3, providing the aforementioned insulation of the cartridge assembly from an adjacent cartridge assembly.

Of course, the various components of the cartridge assembly, including the lock and bracket, can be made of any suitable material including metal and plastics, with adequate electrical insulation being provided where the components are made of an electrically conducting (e.g., metal) material.

In operation, PCI compliant card 33 is assembled into holder 19, utilizing 1 to 4 bracket assemblies 25. The height of first element 31 of each bracket assembly 25, above base members 43, 45 of holder 19, is adjusted through use of screws 27, 29 in slots 21, 23 and 55 in holder 19, to adjust bracket assembly 25 to the height of PCI compliant card 33. Holder 19, lever 7 and carrier 3 are assembled to form cartridge assembly 1, which is inserted into housing 63 of the input/output bay by sliding hanger flanges 32 of carrier 3 above hanger structure 67 on the inside surface of top 65 of housing 63, so as to retain cartridge assembly 1 suspended from top 65 of housing 63 of the input/output bay. Lever 7 is positioned as shown in FIG. 5, being extracted from the cartridge assembly such that, in the vertical direction lever 7 and holder 19 (and PCI compliant card 33 held thereby) are in raised positions. An index feature of indexing structural element 100 in cartridge assembly 1 controls cartridge insertion, as shown in FIG. 7. After properly positioning cartridge assembly 1, lever 7 is pushed in lateral direction L into cartridge assembly 1. Due to the linear camming surfaces of lever 7 with elements 11a–11d of carrier 3 following the camming surfaces, the long edges of lever 7 are moved downwardly. This moves holder 19 and PCI compliant card 33 held thereby downwardly, and also moves lock 5 downwardly. Thus, motion of the lever drives (1) the assembly containing holder 19, PCI compliant card 33 and bracket assemblies 25, and (2) lock 5. Moreover, the cams provide a mechanical advantage to the driven components, especially where lever 7' is used, as discussed previously.

When lever 7 is fully inserted, PCI compliant card 33 is lowered such that connectors 47 of PCI compliant card 33 are inserted into engagement with connectors 73 of base board 74, and lock 5 is lowered to be operative to prevent removal of the assembly.

EMI gate 69 is then seated, which (1) depresses intrusion switch 101 so as to indicate completion of engagement with base board connectors 73, (2) provides EMI shielding, (3) locks lever 7 in fully inserted position; and (4) supports housing 63 of the input/output bay during any moving thereof (e.g., insertion in a completed system). Moreover, EMI gate 69 can interlock with adjacent EMI gates.

In the foregoing, illustrative aspects of the present invention have been described in connection with a computer utilizing a PCI compliant card. However, the present invention is not limited to computers, and is not limited to systems utilizing PCI compliant cards. That is, the present invention is applicable generally to other areas of technology, including the telecommunications industry, utilizing card components, and wherein such card components are to be electrically connected to connectors of a system.

According to various aspects and illustrative embodiments of the present invention, a compact design is achieved. For example, only one inch of additional input/output bay height is required on a one inch base board connector pitch. Moreover, the structure is extremely simple, needing, for example, only connection structure between the carrier and holder and lever, with no additional parts. For example, eight pins total in the carrier, with four of these eight pins through the lever slots and four pins through the holder, control movement of the assembly and component parts thereof. Movement of the holder can be confined to vertical movement, by a simple and effective technique. In addition, the components of the assembly can be snapped together for fastening, requiring no additional components for fastening; keyhole-shaped slots in the lever and holder, and corresponding protruding members in the carrier, provide easy and efficient capture and connection of the components, while providing easy relative motion therebetween. Moreover, electromagnetic interference is reduced, and an assembly is provided which can be used with card components having various form factors, achieving maximum flexibility. In addition, unalerted removal of a card component can be avoided.

While there have been shown and described several examples and illustrative embodiments in accordance with the present invention, it is understood that the same is not limited thereto, but is susceptible of numerous changes and modifications as known to those skilled in the art. Therefore, the invention is not limited to the details shown and described herein, but is intended to cover all such changes and modifications as are encompassed by the scope of the appended claims, including equivalents thereof.

What is claimed is:

1. A cartridge assembly, comprising:
   (1) a carrier; (2) a holder for supporting a card component; and (3) a lever,
   wherein the carrier, holder and lever have connecting structure adapted to connect both the holder and the lever to the carrier such that the holder and the lever are movable relative to the carrier when connected thereto; the lever has a camming surface and the carrier has a member adapted to follow said camming surface, the camming surface being configured and positioned such that lateral motion of the lever in a first direction causes displacement of the lever in a second direction different from the first direction; and the lever and holder are adapted to be connected to each other such that said displacement of the lever in the second direction causes movement of the holder in the second direction.

2. The cartridge assembly according to claim 1, wherein said holder is adapted to be movably connected to said carrier such that the carrier restrains the holder from movement in the first direction.

3. The cartridge assembly according to claim 1, wherein the first direction is horizontal, and the second direction is vertical.

4. The cartridge assembly according to claim 1, wherein the connecting structure of the carrier, holder and lever includes first protruding structures on the carrier which are adapted to slide along the camming surface, and second protruding structures on the carrier which are adapted to be positioned in slots in the holder.

5. The cartridge assembly according to claim 4, wherein said camming surface includes slots in the lever, and wherein the first and second protruding structures are respectively protruding structures which are adapted to snap-fit into the slots in the lever and which are adapted to snap-fit into the slots in the holder.

6. The cartridge assembly according to claim 1, wherein each of the carrier, the lever and the holder is made of sheet metal.

7. The cartridge assembly according to claim 1, wherein at least one of the lever, the holder and the carrier is made of sheet metal, and at least one other of the lever, the holder and the carrier is made of plastic.

8. The cartridge assembly according to claim 1, wherein the carrier is made of sheet metal, wherein the carrier has one side adjacent the lever, and wherein the cartridge assembly further comprises a sheet of electrical insulating material facing said one side with said lever and said holder between said one side and said sheet of insulating material.

9. The cartridge assembly according to claim 1, wherein the lever includes a further camming surface, and wherein the assembly further comprises a lock, which has thereon a member adapted to follow said further camming surface of the lever, the further camming surface being configured and shaped such that the lock moves in the second direction upon the lateral motion of the lever.

10. The cartridge assembly according to claim 1, wherein the holder includes bracket structure connected to a main body of the holder, for retaining the card component, the bracket structure being movable in the second direction so as to be able to retain card components having different form factors in the first and second directions.

11. The cartridge assembly according to claim 1, wherein the holder has a main body that is U-shaped, having two parallel longer legs and a leg extending therebetween at one end, and the lever, when both the holder and lever are attached to the carrier, extends parallel to and between the longer legs.

12. The cartridge assembly according to claim 1, wherein the card component is a peripheral component interconnect compliant card.

13. The cartridge assembly according to claim 1, wherein the camming surface of the lever is configured and positioned such that upon lateral motion of the lever in the first direction, initially a first end of the lever moves a larger distance in the second direction than does a second end of the lever, opposite the first end; and then in continued lateral motion of the lever the second end of the lever moves a larger distance in the second direction, during the continued lateral motion, than does the first end of the lever.

14. The cartridge assembly according to claim 4, wherein the camming surface is provided by slots in the lever, and the first protruding structures are adapted to slide in the slots in the holder.

15. The cartridge assembly according to claim 4, wherein the holder is adapted to be removably connected to the carrier, and the lever is adapted to be removably connected to the carrier.

16. The cartridge assembly according to claim 4, wherein the slots in the holder extend vertically.

17. The cartridge assembly according to claim 15, wherein the slots in the holder are keyhole-shaped, and the first protruding structures on the carrier are adapted to fit in the keyhole-shaped slots in the holder; wherein the camming surface is provided by keyhole-shaped slots in the lever; and wherein the second protruding structures are adapted to fit in the keyhole-shaped slots in the lever.

18. The cartridge assembly according to claim 17, wherein each of the first protruding structures on the carrier has a column portion extending from the carrier and an end portion, the end portion being wider than the column portion, such that the first protruding structures are adapted to be captured in the slots in the holder; and each of the second protruding structures has a column portion extending from the carrier and an end portion, the end portion of each of the second protruding structures being wider than the column portion thereof, such that the second protruding structures are adapted to be captured in the slots in the lever.

19. The cartridge assembly according to claim 9, wherein said further camming surface is a further slot in said lever, and wherein said member on the lock includes a projecting member which rides in said further slot in said lever and extends through said carrier.

20. The cartridge assembly according to claim 19, wherein the further slot in said lever is a keyhole-shaped slot; and wherein said projecting member on the lock extends in said keyhole-shaped slot in said lever and also through a slot, in the carrier, elongated in the second direction, to permit movement of the lock in the second direction and not in the first direction.

21. The cartridge assembly according to claim 20, wherein said projecting member on the lock has a column portion and an end portion, the end portion being wider than the column portion, such that the projecting member on the lock is adapted to be captured in the keyhole-shaped slot in said lever.

22. The cartridge assembly according to claim 10, wherein the bracket structure includes first elements for holding card components and second elements for attaching the bracket structure to the holder; wherein the main body of the holder has elongated slots in an upper region thereof; wherein the carrier has openings corresponding to the elongated slots in the main body of the holder, to expose the elongated slots in the main body of the holder when the holder is connected to the carrier; wherein the second elements pass through the elongated slots in the main body of the holder and the openings in the carrier; and wherein the openings in the carrier are larger than the elongated slots in the main body of the holder to permit movement of the holder, and the card components assembled to the holder, in the second direction.

23. The cartridge assembly according to claim 11, wherein the holder further comprises a bar extending between and attached to the longer legs of the holder, adjacent the end of the main body opposite said one end.

24. The cartridge assembly according to claim 13, wherein the lever and holder are adapted to be connected to each other such that during initial movement of the first end of the lever a larger distance in the second direction than that of the second end of the lever, a corresponding first end of the holder moves a larger distance in the second direction than does a second end of the holder opposite the first end of the holder; and, during said continued lateral motion of the lever the second end of the holder moves a larger distance in the second direction than does the first end of the holder.

25. Computer structure comprising:
a frame member, forming an input/output bay, with an opening exposing the input/output bay, the opening being in the front, rear or side of the frame member; and
a cartridge assembly according to claim 1, positioned in the input/output bay and capable of being removed therefrom through the opening exposing the input/output bay.

26. Computer structure according to claim 25, having a plurality of openings exposing the input/output bay, and further including electromagnetic interference gates covering the plurality of openings exposing the input/output bay, each opening exposing the input/output bay having an individual electromagnetic interference gate.

27. Computer structure according to claim 25, wherein the input/output bay includes an input/output base board assembly, said base board assembly having base board connectors associated with the opening; wherein a peripheral component interconnect compliant card is held by said holder; and wherein electrical connectors of the peripheral component interconnect compliant card are in electrical contact with the base board connectors of said base board assembly.

28. Computer structure according to claim 25, wherein said frame member is a frame member of a server.

29. Computer structure according to claim 26, wherein the input/output bay includes an input/output base board assembly, said base board assembly having base board connectors respectively associated with the openings; wherein a set of base board connectors associated with an opening has an electrical switch associated therewith to initiate a power down sequence of said set of base board connectors; and wherein said switch is positioned such that when the gate covers the opening the switch is closed and when the gate is removed the switch is opened to initiate the power down sequence of the set of base board connectors.

30. Computer structure according to claim 27, wherein the camming surface of the lever is configured and positioned such that upon lateral motion of the lever the electrical connectors of the peripheral component interconnect compliant card progressively come into contact with the base board connectors of said base board assembly.

31. Holder structure for a card component, comprising:
a main body, having a base member for supporting a bottom edge of the card component and elongated slots in an upper region of the main body; and
at least one bracket member attached to the main body, for holding an upper edge of the card component, wherein each bracket member has a first element for retaining the card component, and second elements, adapted to move in the elongated slots in the main body, the elongated slots in the main body being shaped and positioned such that movement of the second elements in the elongated slots in the main body provides movement of the first element in a direction away from or towards the base member.

32. The holder structure according to claim 31, wherein the first element is an element having a groove therein for having the top edge of the card component retained in the groove, and each of the second elements includes a screw and nut for fastening the bracket member to the main body.

33. The holder structure according to claim 31, wherein said card component is a peripheral component interconnect compliant card, having electrical connectors extending below the base member of the main body.

34. A method of inserting a card component into a device, comprising the steps of:

supporting the card component by a holder member, assembling the holder member and a lever together, to form a cartridge assembly, the lever extending outwardly from the cartridge assembly;

sliding the cartridge assembly into the device, through an opening in the device, the outwardly extending lever being exposed through said opening; and pushing the lever in a first direction into the opening, with motion of the lever in the first direction causing displacement of the lever in a second direction different from the first direction, and the displacement of the lever in the second direction forcing movement of the holder, and card component held thereby, in the second direction.

35. The method according to claim 34, wherein the device is a computer, and the card component is a peripheral component interconnect compliant card; wherein the opening is in the front, rear or side of an input/output bay of the computer; wherein the first direction is horizontal and the second direction vertical; and wherein the lever is pushed to move the holder member and card vertically downwardly, to contact electrical connectors of the card to electrical connectors in the input/output bay.

36. The method according to claim 34, wherein initial motion of the lever in the first direction causes a first end of the card component to move a greater distance in the second direction than does a second end of the card component, the second end being opposite the first end; and continued motion of the lever in the first direction causes said second end of the card component to move a larger distance in the second direction, during said continued motion, than does the first end.

37. The method according to claim 35, wherein electrical power to the electrical connectors of the input/output bay, to contact the electrical connectors of the card, is cut off during the steps of sliding and pushing; and wherein the method includes the further step of applying an electromagnetic interference gate over said opening, after the pushing step, the application of the gate over the opening initiating a power up sequence to be applied to said electrical connectors of the input/output bay contacting the electrical connectors of the card.

* * * * *